United States Patent [19]
Hartstein et al.

[11] Patent Number: 5,508,543
[45] Date of Patent: Apr. 16, 1996

[54] LOW VOLTAGE MEMORY

[75] Inventors: Allan M. Hartstein, Chappaqua, N.Y.;
Michael A. Tischler, Danbury, Conn.;
Sandip Tiwari, Ossining, N.Y.

[73] Assignee: International Business Machines Corporation, Armonk, N.Y.

[21] Appl. No.: 236,751

[22] Filed: Apr. 29, 1994

[51] Int. Cl.$^6$ .................................................. H01L 29/76
[52] U.S. Cl. .......................... 257/314; 257/315; 257/321; 257/325
[58] Field of Search ..................................... 257/314, 315, 257/321, 325

[56] References Cited

U.S. PATENT DOCUMENTS 3,856,587  12/1974  Yamazaki et al. .
4,115,914   9/1978  Harari ..................................... 257/314
4,507,673   3/1985  Aoyama et al. .

FOREIGN PATENT DOCUMENTS 1297899  11/1972  United Kingdom .

Primary Examiner—Edward Wojciechowicz
Attorney, Agent, or Firm—Blaney Harper; Ronald L. Drumheller

[57] ABSTRACT

A floating gate is inserted into the gate stack of an EEPROM cell. For an N channel EEPROM device, the floating gate is composed of a material having a conduction band edge (or fermi energy in the case of a metal or composite that includes a metal) at least one and preferably several kT electron volts below the conduction band edge of the channel region. The floating gate material thus has a larger electron affinity than the material of the channel region. This allows the insulator separating the floating gate and the channel to be made suitable thin (less than 100 angstroms) to reduce the writing voltage and to increase the number of write cycles that can be done without failure, without having charge stored on the floating gate tunnel back out to the channel region during read operations. For a P channel EEPROM device, the floating gate is composed of a material having a valence band edge (or fermi energy in the case of a metal or a composite that includes a metal) at least one and preferably several kT (eV) above the valence band edge of the channel region.

32 Claims, 4 Drawing Sheets n-channel device p-channel device

LOW VOLTAGE MEMORY

FIELD OF THE INVENTION

This invention relates generally to the field of semiconductor devices. In particular, this invention relates to a semiconductor charge storage structure. More specifically, this invention relates to an electrically erasable and programmable field effect transistor (FET) memory cell.

BACKGROUND OF THE INVENTION

A nonvolatile memory maintains stored data even though the memory is not powered for a period of time. A read only memory is a memory which contains data that cannot change. Nonvolatile read only memories (often called ROMs) are very useful in computers because they can provide a computer with initial instructions or data when the computer is first powered up. The usefulness of these memories is limited however because the data in a ROM memory can only be programmed once. This means that the entire ROM memory must be discarded when the initial instruction set or data is changed.

Nonvolatile programmable memories (often called PROMs) are memories in which the stored instructions or data can be changed without discarding the entire memory. Typical prior art PROMs electrically store charge in the gate structure of a field effect transistor (FET) device, which has the effect of turning "on" or "off" the FET and, in turn, programming the memory. The stored charge is usually removed from the FET gate structure by shining ultra-violet light on the gate structure. The removal of the charge in this manner erases the programming without physically damaging the memory so that it can be reprogrammed. This type of programming and erasing of the PROM is a time consuming and difficult process, so it is impractical to erase and reprogram such a device frequently.

However, PROMs which are both electrically erasable as well as programmable are practical to erase and reprogram frequently, and as a result, are very useful in computers or electrical devices where power is frequently interrupted. This is because the data and instructions the computer was processing can be stored when the power is interrupted and recalled when power is restored.

Electrically erasable programmable memories (often called EEPROMs) were developed in response to the need for a nonvolatile memory which could have the stored data changed on a frequent basis. FIG. 1a illustrates an example of a prior art EEPROM cell in cross-section. The EEPROM cell is a conventional FET having a source region 14, a drain region 16, a channel region 4 and a control gate region 10 separated from the source, drain and channel by an oxide layer 8, but an additional gate region 6 has been added (a floating gate) as well as an additional oxide region 12 between the floating gate and the channel region.

An additional transistor is required together with this or a group (block) of these transistors in order to isolate this or the block of memory elements from others that are being read or written. FIG. 1b illustrates a prior art read and write circuit for the EEPROM shown in FIG. 1a. An array is organized into columns of devices connected to individual bit lines 18, 18' and rows of devices connected to individual word lines 20. A Write operation involves injecting carriers (either electrons or holes) into the floating gate region. This is accomplished by biasing the control gate positively (or negatively for a P channel device) and grounding the source and the drain. This injects electrons (or holes for a P channel device) from the channel into the floating gate region. Negative charge in the floating gate region of an N channel device raises the threshold voltage of the N channel device, while holes in the floating gate region of a P channel device raises the threshold of the P channel device.

An Erase operation involves removing electrons (or holes for a P channel device) from the floating gate and requires positive voltage (or negative voltage for a P channel device) to be applied to the drain, a floating source, and a grounded control gate and substrate. By using a thick enough tunnelling oxide, Read operation, which involves small voltages, does not disturb the threshold voltage of a device.

The problem with these prior art EEPROM devices is that there are limitations as to how many times a charge can be injected and removed from the floating gate. This is because of hot carrier induced reliability problems. To maintain nonvolatility, relatively thick oxides (about 100 Angstroms) are required for the tunnelling oxides. This requires large voltages to be applied for injection, by Fowler-Nordheim tunnelling, of electrons or holes. This produces hot carriers, and hot carriers cause degradation of the oxide due to formation of traps, reactions at interfaces, and diffusion of species released during relaxation of hot carriers at interfaces. Large voltages, exceeding 10 volts, are currently required to charge and discharge the floating gate region through the tunnelling oxide. This requires on-chip generation of these voltages or an additional power supply. Additionally, charging and discharging times are still in milliseconds because of the small currents flowing through the insulating tunnelling oxide.

An alternate prior art method for increasing the retention time of data in an EEPROM without raising the charging voltage is to replace the floating gate with a charge trapping layer. In particular, charge trapping layers have been formed of silicon nitride and silicon clusters, a plurality of silicon dioxide layers interposed between a plurality of silicon nitride layers, silicon nitride, or non-stoichiometric silicon oxide. The trapping layers are intended to retain the charge injected into the trapping layers. The problem with this particular technique is that carriers are injected into the trapping layers again by Fowler-Nordheim tunnelling through the oxide covering the channel region due to the applied electric field. Controlling the thickness and stoichiometry such that these characteristics are met is a difficult process. The number of times one can charge and discharge, the slowness of the charging and discharging process, and the large powers needed (because of large voltages required) places constraints on the use of all these devices in a vast variety of memory applications.

OBJECTS OF THE INVENTION

It is an object of the present invention to manufacture an electrically erasable programmable memory (EEPROM) cell.

A further object is to manufacture an EEPROM having a low charging voltage.

It is another object of the present invention to manufacture a low voltage EEPROM cell having a large data retention time.

It is also an object to more reliably manufacture a low voltage EEPROM cell.

A still further object is to produce read, write and erase times for an EEPROM cell that are in sub-microseconds and hence substantially faster than other non-volatile memories, all at low voltages.

SUMMARY OF THE INVENTION

The objects of the present invention are accomplished by inserting into the gate stack of an N channel EEPROM device a thin floating gate composed of a material having a conduction band edge (or fermi energy in the case of a metal or composite that includes a metal) at least one and preferably several kT electron volts (eV) below the conduction band edge of the channel region. Thus, the floating gate region is chosen to be composed of a material that has a larger electron affinity than the material of the channel region.

The objects of the present invention may be accomplished alternatively by inserting into the gate stack of a P channel EEPROM device a thin floating gate composed of a material having a valence band edge (or fermi energy in the case of a metal or a composite that includes a metal) at least one and preferably several kT electron volts above the valence band edge of the channel region.

In both cases, the thin floating gate has a differential in energy band edge with respect to the channel region and acts as an improved trapping region to which charge carriers easily tunnel but from which charge carriers cannot easily tunnel at bias conditions commonly encountered during reading and writing.

For an N channel device, the floating gate may be a germanium layer having a thickness of less than 100 Angstroms. Such a thin floating gate, in combination with silicon dioxide between the floating gate and the channel region and silicon dioxide between the floating gate and the control gate, forms a charge trapping potential well. The silicon dioxide between the channel and the floating gate is thin enough for electrons to directly tunnel through (as opposed to the Fowler-Nordheim tunnelling of conventional EEPROM structures). Electrons which have entered the potential well occupy energy states that are lower in energy than the channel. Electrons in this lower energy state therefore cannot easily tunnel out of the potential well back into the channel region. Therefore, the thin germanium floating gate facilitates low voltage charging of the potential well and the potential well does not discharge easily.

A similar effect will occur in P channel device if the valance band of the floating gate (or fermi energy in the case of a metal or composite that includes a metal) is higher than the valance band of the channel region.

DESCRIPTION OF THE PREFERRED EMBODIMENT

Figure 1A:
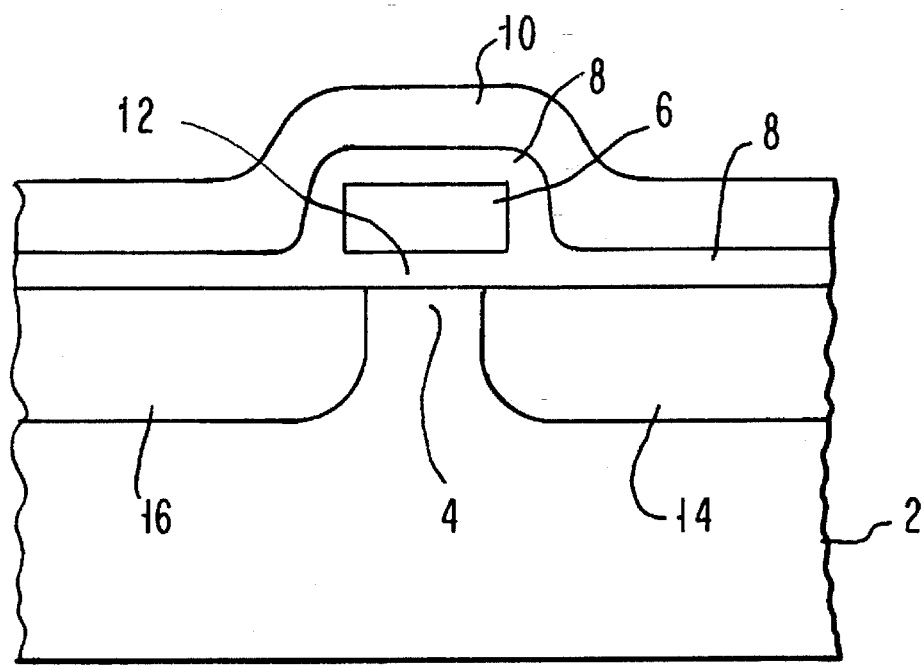
FIG. 1a shows a prior art EEPROM cell.
Figure 1B:
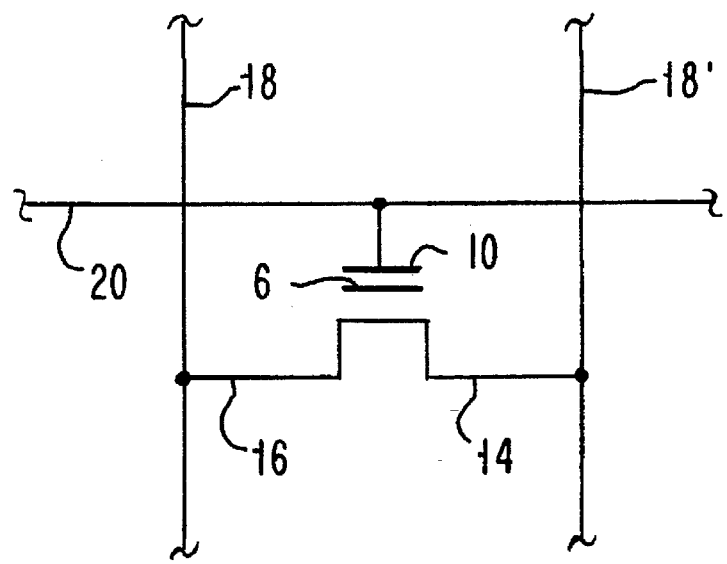
FIG. 1b shows a prior art reading and writing circuit for an array of EEPROM cells.
Figure 2A:
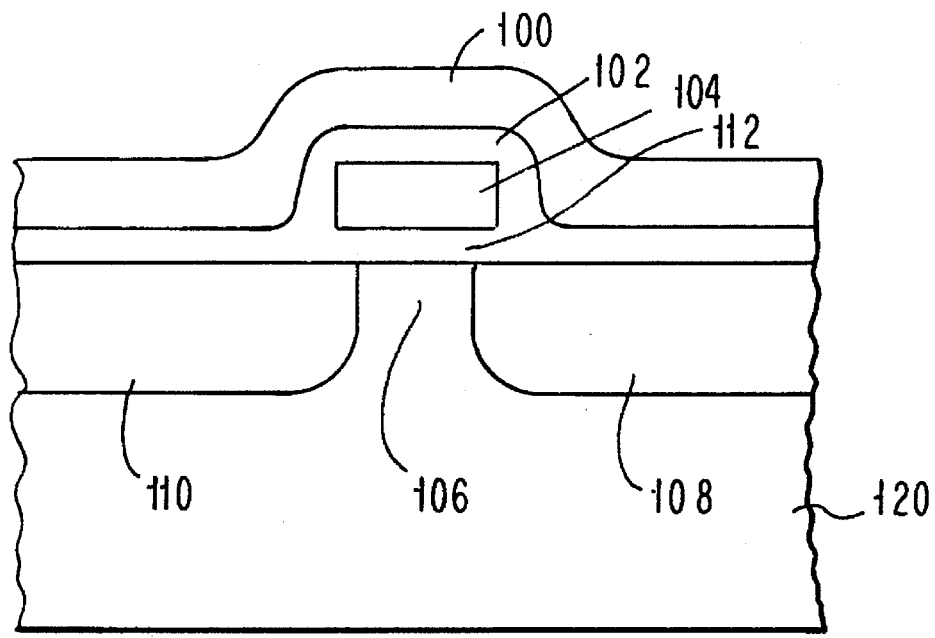
FIG. 2a illustrates an embodiment of a memory cell in accordance with the present invention.
Figure 2B:
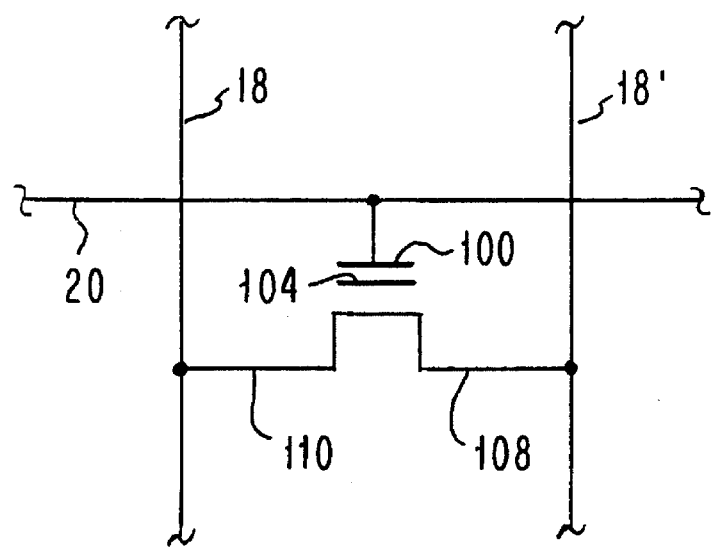
FIG. 2b shows a reading and writing circuit for an array of memory cells in accordance with the present invention.

FIGS. 2a and 2b illustrates an embodiment of the present invention. FIG. 2a shows a cross-section of a memory cell in accordance with one embodiment of the present invention and FIG. 2b illustrates the wordline and bit line connections to the memory cell shown in FIG. 2a. In FIG. 2a, substrate 120 has source impurity region 108 separated from drain impurity region 110 by channel region 106. As is well known, carriers are transported across the channel connecting the source and drain only in a thin region adjacent to the interface with the overlying insulating material.

The substrate is a silicon substrate in which impurity regions 108 and 110 are formed through conventional silicon processing such as diffusion or ion implantation. The source and drain regions have the same impurity type, which is the opposite impurity type of the substrate. That is, when the substrate is P type, the source and drain regions are N type and the FET is an N channel device. When the substrate is N type, the source and drain regions are P type and the FET is a P channel device.

The impurity concentration of the source and drain regions is greater than approximately $10^{19}/cm^3$ whether N or P type, and the impurity concentration of the channel region is less than approximately $10^{18}/cm^3$ whether N or P type. An insulation layer 112 is formed over the channel region and between the source and drain regions. The insulation layer 112 is interposed between the floating gate 104 and the channel region 106 and is generally formed of a silicon dioxide material which has a low charge carrier trap density at the interface with the channel region 106. However, the insulation layer 112 can be formed of any insulator material which is suitable for FET operation. The insulation layer has a thickness of approximately 5–40 Angstroms in order to facilitate charge carrier direct tunneling through the gate material under an applied electric field.

The floating gate or charge trapping layer 104 is composed of a material which, in the case of an N channel device, has a conduction band edge that is lower than the channel region conduction band edge by at least 0.025 electron volts (eV). Alternatively, for P channel devices, the floating gate 104 is composed of a material that has a valance band edge above the valance band edge of the channel region 106 by at least 0.025 electron volts (eV).

Insulator layer 102 is interposed between the control gate 100 and the floating gate layer 104. The insulator layer 102 is generally formed of the same material as insulator layer 112. However, insulator layer 102 can be formed from a different type of materials, such as silicon nitride, so long as it sufficiently insulates the control gate from the floating gate. The control gate 100 is formed over the floating gate and the insulator layer 102. The control gate is generally formed using doped poly-silicon but can also utilize a metallic conductor such as tungsten, tungsten silicide, aluminum-copper-silicon.

The operation of one embodiment of the memory cell of the present invention is illustrated in FIG. 2b. Wordline 20 is connected to control gate 100, bitline 18 is connected to drain 110, and source line 18' is connected to source 108. Data is written to the memory cell by applying a first charge voltage on the wordline 20 with bit line 18 and source line 18' grounded. The first charge voltage is preferably less than approximately 5 volts. In an N channel type device, having a substrate doping of ($1 \times 10^{17}/cm^3$), with a silicon dioxide insulator region 112 having a thickness of 16 Angstroms, and having a channel width of 10 microns and a channel length of 0.25 microns, the write time is below 200 ns to cause a threshold shift exceeding 0.5 V.

Once data has been written to the memory cell, the voltages are disconnected from the wordline and bitline and source line and the charge remains in the memory cell. The existence of charge (and hence, data) in the memory cell is detected by sensing the threshold voltage, i.e., the state of conduction of the device. This is the read cycle of the device. When current is sensed during the read time in the bitline 18, then no charge is in the floating gate. When very low current is sensed during the read time, then charge is stored in the floating gate. The existence of charge in the floating gate represents either a data value 1 or 0 in the memory cell as desired.

Data is erased from the floating gate by applying an erase voltage which is substantially equal to the first charge voltage on the bitlines 18 and source line 18' while connecting the wordline 20 to a low voltage such as ground. A threshold shift of 0.5 V (equivalent to $1\times10^{12}/cm^2$ charge density in the floating gate) can be removed in about the same time as the write time in a device having the same dimensions as described in the gate charge operation.

Proper operation of the memory cell according to this invention depends upon the fact that the tunnelling of charge carriers, which is by direct tunnelling, into the floating gate 104 is easier than any tunnelling out of the floating gate under conditions of write and read cycles. This charge carrier tunnelling characteristic exists in the memory cell of the present invention because of the choice of materials and thicknesses for the floating gate 104 and the insulator layer 112.

Figure 3A:
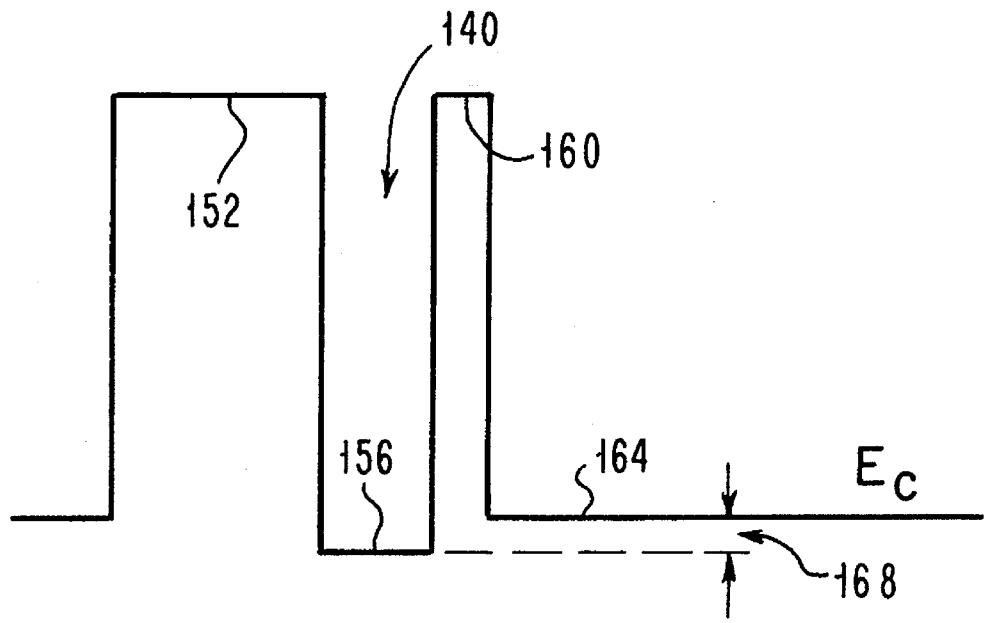
FIG. 3a is a schematic of the band alignment for an N channel memory cell in accordance with this invention.
Figure 3B:
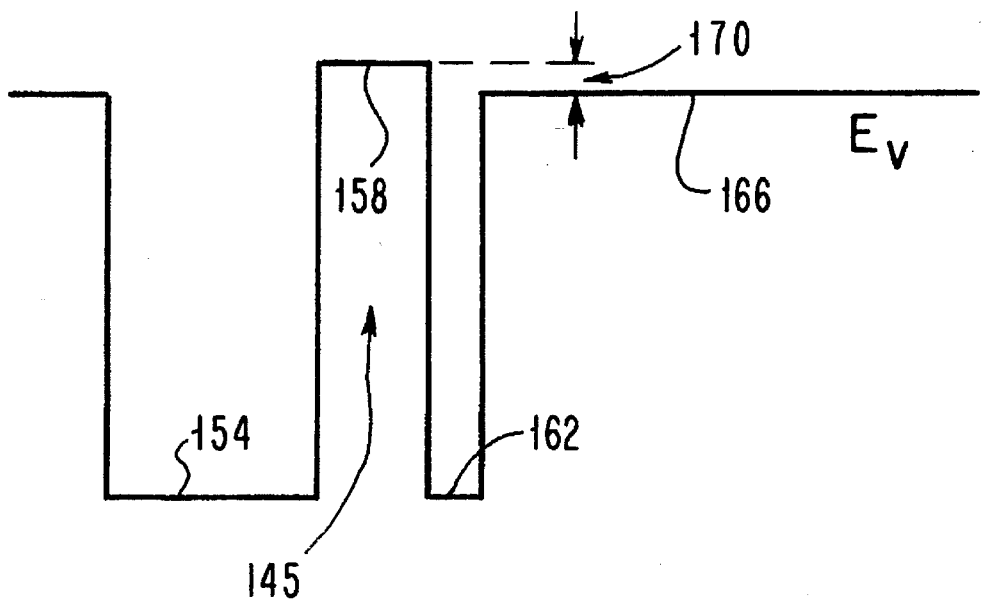
FIG. 3b is a schematic of the band alignment for a P channel memory cell in accordance with this invention.

The tunnelling characteristics of the charge carriers in the present invention will be explained now by reference to FIG. 3a and FIG. 3b, which illustrate an energy band diagram of a gate stack structure of an N channel FET device and P channel FET device respectively in accordance with the present invention.

The relative energies (E) are plotted schematically at zero applied bias (assuming a flat-band of 0 V) of the valance band edges (FIG. 3b) and the conduction band edges (FIG. 3a) as a function of vertical distance (X) from the control gate 100 through the insulator layer, through the floating gate and into the channel region 106.

For an N channel cell (FIG. 3a), the conduction band edge 164 of the channel region 106 is lower than the conduction band edge 160 of the insulator layer 112. Conduction band edge 156 is less than conduction band edge 164 and the difference 168 is greater than or equal to approximately 0.025 electron volts (eV). Conduction band edges 152 and 160 are significantly higher than conduction band edge 164 and the transition between conduction band edges 152, 156, and 160 form the potential well 140.

For a P channel cell (FIG. 3b), potential well 145 is formed by the transition between valance band edges 154, 158, and 162. Valence band edge 166, corresponding to the channel region 106, is lower than the valence band edge 158 corresponding to the floating gate region 104. The difference 170 between valence band edges 166 and 158 is greater than or equal to approximately 0.025 electron volts (eV). Valence band edge 162 corresponds to the insulator region 112 and valence band edge 154 corresponds to insulator region 102.

In N channel devices (or P channel devices), the potential barrier between the potential well 140 (or 145) and the channel region, formed by the insulator layer 112, must be thin enough such that direct and sufficient tunnelling of electrons through the potential wall from the channel region into the potential well 140 (or 145) occurs when the electric field created by the application of the first charge voltage on the control gate acts on the cell structure. When silicon dioxide is used as the material for the insulator layer 112, and the first charge voltage is 3 volts applied in a write time (on the order of sub-microseconds), then the thickness of the insulator layer 112 (and hence, the thickness of the potential wall to the potential well 140 or 145) must be less than approximately 40 Angstroms and is preferably 10–40 Angstroms.

For N channel cells, when electrons from the channel region tunnel into the potential well 140, which may be thin enough to have quantized states, they may initially tunnel into higher energy states but eventually will fall into lower energy states. The lowest energy state of the potential well 140 is at least 0.025 electron volts (eV) below the conduction band edge in the channel region. Electrons which tunnel into the potential well 140 and exist at the lower energy state cannot tunnel out of the potential well because they are now thermalized and few carriers exist at higher energies.

For P channel cells, when holes from the channel region tunnel into the potential well 145, they similarly eventually fall to the bottom (actually top in FIG. 3b) of the potential well 145 and also cannot tunnel out of the potential well.

Figure 4:
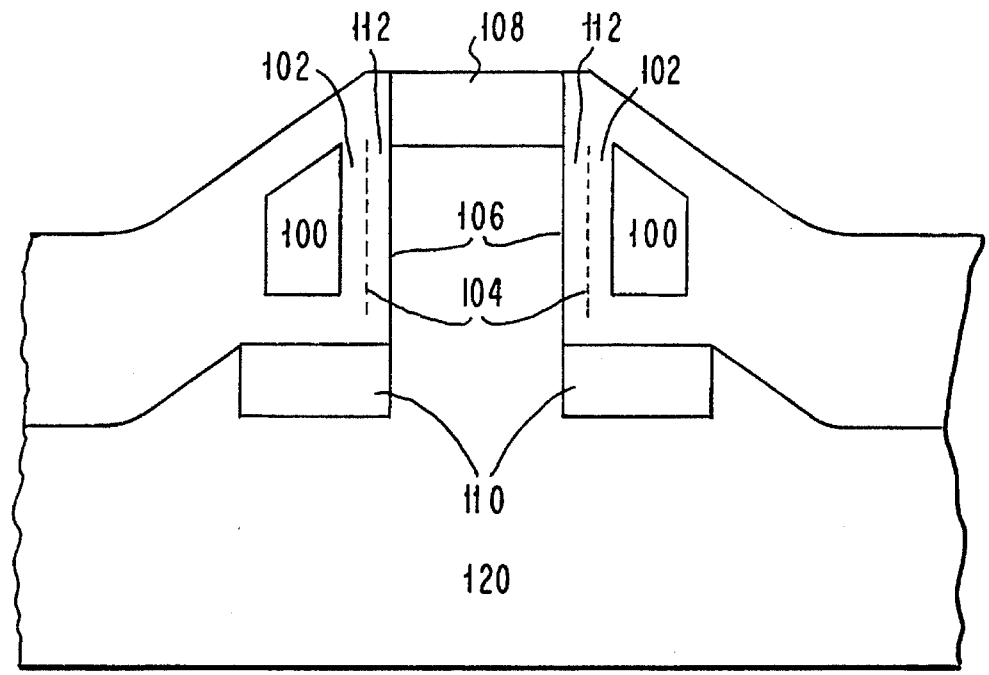
FIG. 4 is another geometry for a memory cell in accordance with this invention.

FIG. 4 illustrates another geometry for a memory cell in accordance with this invention. Corresponding elements in FIG. 4 and FIG. 2a have been similarly identified with the same reference numbers for better understanding. In this case the drain region 108 and source region 110 are not in a planar configuration and the channel region 106 is oriented perpendicularly with respect to the substrate 120. In FIG. 2a, the channel is oriented parallel to the substrate 120. Operation of the FIG. 4 embodiment is substantially the same as in the FIG. 2a embodiment except for the differences in FET geometry. The floating gate region in FIG. 4 is shown as a dotted line 104. FIG. 4 is a cross-section view. The illustrated device is actually circularly symmetric about a central axis so that the control gate (and the floating gate) actually surround a central pedestal that supports the drain region 108.

Figure 5:
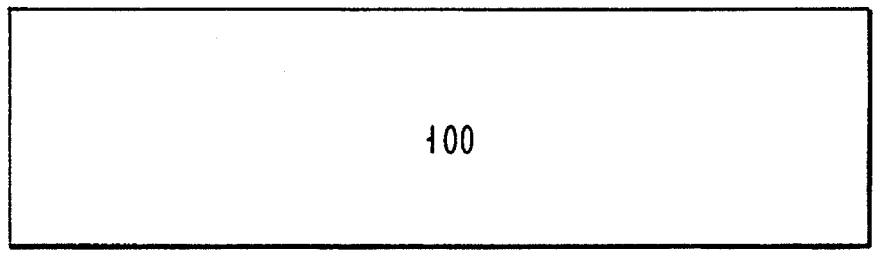
FIG. 5 is a detailed cross-section of a floating gate in accordance with this invention wherein the charge storage material in the floating gate consists of clusters or islands of material.
Figure 5:
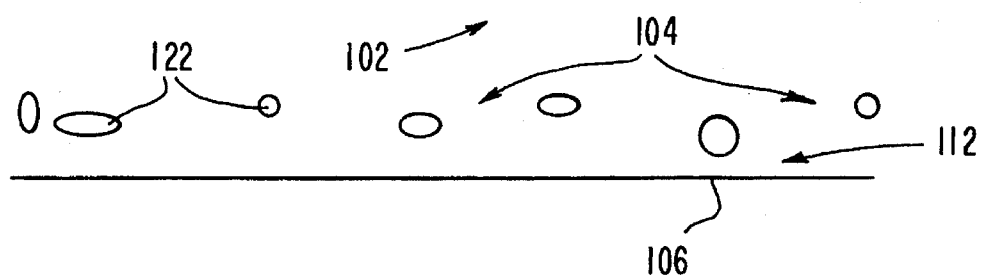

FIG. 5 shows another embodiment of the floating gate structure. In this case the charge storage material is composed of clusters or islands 122 of one material within a layer of different material. The floating gate region may be viewed as a layer of composite material containing the clusters. Another layer of material below and above that floating gate region do not contain the clusters. As shown in FIG. 5, the material forming the regions 102, 112 and the matrix carrying the clusters 122 can all be the same material. If the same material forms all of these regions, it is an insulating material. If the floating gate matrix carrying the clusters is composed of a different material than layers 102 and 112, this matrix can be a semiconductive material.

In practicing this invention, it should be understood that the channel region may be composed of virtually any doped semiconductor material. Without intending any limitation, this includes silicon, silicon carbide, silicon/germanium mixtures, germanium and any group III–V semiconductor material, such as GaAs.

Similarly, it should be understood that the floating gate region may be composed of virtually any semiconductor material satisfying the conduction band edge or valence band edge constraint (depending upon whether the cell is a N channel or P channel device respectively) as set forth in accordance with this invention. The floating gate region alternatively may include or be composed of a metal. When the charge storage floating gate region is composed of (or includes) a metal, the Fermi energy of the floating gate material should be at least 0.025 electron volts lower than the conduction band edge of the channel material (in the case of an N channel device) or at least 0.025 electron volts higher than the valence band edge of the channel material (in the case of a P channel device). Metals which can be used for (or included in) the charge storage floating gate region are tungsten, platinum, nickel, cobalt, rhodium, palladium, iridium and mixtures and alloys thereof.

While the invention has been described and illustrated with respect to plural embodiments thereof, it will be understood by those skilled in the art that various changes in the detail may be made therein without departing from the spirit, scope, and teaching of the invention. Therefore, the invention will be understood to be limited only as specified in the following claims.

Having thus described our invention what we claim as new and desire to secure as Letters Patent, is:

1. A charge storage structure for a memory cell, comprising:
   a channel region of a first material having charge carriers of a particular charge carrier type;
   a floating gate region for charge storage comprising a second material, said floating gate region being positioned adjacent to said channel region; and
   an insulator region spacing said floating gate region from said channel region by a distance of between approximately 5 and 100 angstroms,
   said second material having a greater affinity for charge carriers of said particular charge carrier type than said first material by at least kT, where k is Boltzman's constant and T is a normal operating temperature for said insulator region in degrees Kelvin.

2. A charge storage structure as defined in claim 1 wherein said first material comprises P type semiconductor material, said channel region is an N channel and said particular charge carrier type is electrons.

3. A charge storage structure as defined in claim 2 wherein said first and second materials are semiconductors, each having a conduction band edge, and said conduction band edge of said second material is lower than said conduction band edge of said first material by at least 0.025 electron volts.

4. A charge storage structure as defined in claim 3 wherein said first material comprises a doped semiconductor material selected from the group consisting of silicon carbide, silicon, silicon/germanium, germanium and group III–V semiconductor compounds, and said second material comprises a semiconductor materials selected from the group consisting of silicon, germanium, silicon/germanium and group III–V semiconductor compounds.

5. A charge storage structure as defined in claim 3 wherein said first material comprises silicon, said second material comprises germanium and said insulator region comprises silicon dioxide.

6. A charge storage structure as defined in claim 2 wherein said first material comprises a semiconductor having a conduction band edge, said second material comprises a metal and has a fermi energy, and said fermi energy of said second material is lower than said conduction band edge of said first material by at least 0.025 electron volts.

7. A charge storage structure as defined in claim 6 wherein said first material comprises a doped semiconductor material selected from the group consisting of silicon carbide, silicon, silicon/germanium, germanium and group III–V semiconductor compounds, and said second material comprises a metal selected from the group consisting of tungsten, platinum, nickel, cobalt, rhodium, palladium, iridium and mixtures and alloys thereof.

8. A charge storage structure as defined in claim 1 wherein said first material is N type semiconductor material, said channel region is a P channel and said particular charge carrier type is holes.

9. A charge storage structure as defined in claim 8 wherein said first and second materials are semiconductors, each having a valence band edge, and said valence band edge of said second material is higher than said valence band edge of said first material by at least 0.025 electron volts.

10. A charge storage structure as defined in claim 9 wherein said first material comprises silicon, said second material comprises germanium and said insulator-layer comprises silicon dioxide.

11. A charge storage structure as defined in claim 9 wherein said first material comprises a doped semiconductor material selected from the group consisting of silicon, silicon/germanium, germanium and group III–V semiconductor compounds, and said second material comprises a semiconductor material selected from the group consisting of germanium, silicon/germanium and group III–V semiconductor compounds.

12. A charge storage structure as defined in claim 8 wherein said first material is a semiconductor having a valence band edge, said second material comprises a metal and has a fermi energy, and said fermi energy of said second material is higher than said valence band edge of said first material by at least 0.025 electron volts.

13. A charge storage structure as defined in claim 12 wherein said first material comprises a doped semiconductor material selected from the group consisting of silicon, silicon/germanium, germanium and group III–V semiconductor compounds, and said second material comprises a metal selected from the group consisting of tungsten, platinum, nickel, cobalt, rhodium, palladium, iridium and mixtures and alloys thereof.

14. A charge storage structure as defined in claim 1 wherein said floating gate region is a layer of said second material.

15. A charge storage structure as defined in claim 1 wherein said floating gate region is a layer of insulating material having islands of said second material distributed within said layer of insulating material, said islands of said second material having a diameter on the order of 1–20 nanometers.

16. A charge storage structure as defined in claim 1 wherein said floating gate region is a layer of semiconductive material having islands of said second material distributed within said layer of semiconductive material, said islands of said second material having a diameter on the order of 1–20 nanometers.

17. A charge storage structure for a memory cell, comprising:
   a current path region for carrying charge carriers of a particular charge carrier type between a source and a drain;
   a floating charge storage region positioned adjacent to said current path region for controlling flow of charge carriers through said current path region in dependence upon charge stored in said floating charge storage region; and
   a tunnelling insulator region spacing said floating charge storage region from said current path region by a distance between approximately 5 and 100 angstroms, said floating charge storage region having a greater affinity for charge carriers of said particular charge carrier type than said current path region by at least kT, where k is Boltzman's constant and T is a normal operating temperature for said tunnelling insulator in degrees Kelvin.

18. A charge storage structure as defined in claim 17 wherein said current path region comprises P type semiconductor material having a first conduction band edge, said current path region is an N channel and said particular charge carrier type is electrons.

19. A charge storage structure as defined in claim 18 wherein said floating charge storage region comprises semiconductor material having a second conduction band edge and said second conduction band edge is lower than said first conduction band edge by at least 0.025 electron volts.

20. A charge storage structure as defined in claim 18 wherein said floating charge storage region comprises conductive material and has a fermi energy and said fermi energy is lower than said first conduction band edge by at least 0.025 electron volts.

21. A charge storage structure as defined in claim 17 wherein said current path region comprises N type semiconductor material having a first valence band edge, said current path region is a P channel and said particular charge carrier type is holes.

22. A charge storage structure as defined in claim 21 wherein said floating charge storage region comprises semiconductor material having a second valence band edge and said second valence band edge is higher than said first valence band edge by at least 0.025 electron volts.

23. A charge storage structure as defined in claim 21 wherein said floating charge storage region comprises conductive material and has a fermi energy and said fermi energy is higher than said first valence band edge by at least 0.025 electron volts.

24. An FET memory cell, comprising:
a source region;
a drain region;
a channel region between said source region and said drain region,
said channel region having charge carriers of a particular charge carrier type;
a control gate region adjacent to said channel region for controlling flow of charge carriers through said channel region;
a floating gate region between said channel region and said control gate region for charge storage;
a first insulator region spacing said floating gate region from said control gate region; and
a second insulator region spacing said floating gate region from said channel region by a distance between approximately 5 and 100 angstroms,
said floating gate region having a greater affinity for charge carriers of said particular charge carrier type than said channel region by at least kT, where k is Boltzman's constant and T is a normal operating temperature for said second insulator region in degrees Kelvin.

25. An FET memory cell as defined in claim 24 wherein said channel region comprises P type semiconductor material having a first conduction band edge, said channel region is an N channel and said particular charge carrier type is electrons.

26. An FET memory cell as defined in claim 25 wherein said floating gate region comprises semiconductor material having a second conduction band edge and said second conduction band edge is lower than said first conduction band edge by at least 0.025 electron volts.

27. An FET memory cell as defined in claim 25 wherein said floating gate region comprises conductive material and has a fermi energy and said fermi energy is lower than said first conduction band edge by at least 0.025 electron volts.

28. An FET memory cell as defined in claim 24 wherein said channel region comprises N type semiconductor material having a first valence band edge, said channel region is a P channel and said particular charge carrier type is holes.

29. An FET memory cell as defined in claim 28 wherein said floating gate region comprises semiconductor material having a second valence band edge and said second valence band edge is higher than said first valence band edge by at least 0.025 electron volts.

30. An FET memory cell as defined in claim 28 wherein said floating gate region comprises conductive material and has a fermi energy and said fermi energy is higher than said first valence band edge by at least 0.025 electron volts.

31. An FET memory cell as defined in claim 24 wherein said source region, drain region and channel region have a planar configuration.

32. An FET memory cell as defined in claim 24 wherein said source region, drain region and channel region do not have a planar configuration and said channel region extends between said source region and said drain region in a direction substantially perpendicularly with respect to a substrate on which said FET memory cell has been formed.

* * * * *